United States Patent [19]

Pollack

[11] Patent Number: 5,162,882
[45] Date of Patent: Nov. 10, 1992

[54] SEMICONDUCTOR OVER INSULATOR MESA

[75] Inventor: Gordon P. Pollack, Richardson, Tex.

[73] Assignee: Texas Instruments Incorporated, Dallas, Tex.

[21] Appl. No.: 697,144

[22] Filed: May 8, 1991

Related U.S. Application Data

[62] Division of Ser. No. 534,920, Jun. 8, 1990, Pat. No. 5,039,621.

[51] Int. Cl.⁵ ............................................. H01L 29/78
[52] U.S. Cl. ..................................... 257/349; 257/900
[58] Field of Search ................... 357/23.7, 23.1, 41, 357/4

[56] References Cited

U.S. PATENT DOCUMENTS

| | | | |
|---|---|---|---|
| 4,545,110 | 10/1985 | Maas et al. | 437/44 |
| 4,545,113 | 10/1985 | Vora | 29/578 |
| 4,714,685 | 12/1987 | Schubert | 437/41 |
| 4,722,910 | 2/1988 | Yasaiti | 437/44 |
| 4,839,304 | 6/1989 | Morikawa | 437/39 |
| 4,855,247 | 8/1989 | Ma et al. | 437/44 |
| 4,859,620 | 8/1989 | Wei et al. | 437/44 |
| 4,912,061 | 3/1990 | Nasr | 437/44 |
| 4,956,307 | 9/1990 | Pollack et al. | 437/40 |
| 4,963,502 | 10/1990 | Teng et al. | 437/40 |
| 5,019,522 | 5/1991 | Meyer et al. | 437/44 |
| 5,039,621 | 8/1991 | Pollack | 437/44 |

FOREIGN PATENT DOCUMENTS

| | | | |
|---|---|---|---|
| 56-6474 | 1/1981 | Japan | 437/44 |
| 63-257231 | 10/1988 | Japan | 437/44 |
| 2-125433 | 5/1990 | Japan | 437/40 |

Primary Examiner—Rolf Hille
Assistant Examiner—Steven Loke
Attorney, Agent, or Firm—Ira S. Matsil; B. Peter Barndt; Richard L. Donaldson

[57] ABSTRACT

An improved SOI structure 40 is provided. SOI structure 40 includes a semiconductor mesa 42 formed over a buried insulating layer 46 which overlies a substrate 48. Sidewall insulator regions 50 and 52 are formed along sidewalls 54 and 56, respectively, of semiconductor mesa 42. Sidewall spacers 62 and 64 are formed along sidewall insulator regions 50 and 52, respectively. Sidewall spacers 62 and 64 each include respective foot regions 66 and 68. Foot regions 66 and 68 effectively shift undercut areas 74 and 76 laterally away from semiconductor mesa 42.

11 Claims, 1 Drawing Sheet

SEMICONDUCTOR OVER INSULATOR MESA

The United States government has a paid up license in this invention and the rights in limited circumstances to require the patent owner to license others on reasonable terms as provided for by the terms of Contract No. DNA 001-86-C-0090 awarded by the Defense Nuclear Agency.

This is a continuation of application Ser. No. 07/534,920, filed 06/08/90, now U.S. Pat. No. 5,039,621.

RELATED APPLICATIONS

This application is related to co-pending U.S. Pat. Ser. No. 07/269,803 now U.S. Pat. No. 4,956,307, entitled "Thin Oxide Sidewall Insulators For Silicon Over Insulator Transistors", by Pollack, et al., filed Nov. 10, 1988.

TECHNICAL FIELD OF THE INVENTION

This invention relates in general to semiconductor devices and more particularly to an improved semiconductor over insulator mesa and the method of forming the same.

BACKGROUND OF THE INVENTION

Semiconductor over insulator (SOI) devices provide numerous benefits in contemporary integrated circuit technology. An SOI device includes a semiconductor mesa overlying a buried insulating layer, which itself overlies a semiconductor substrate. Typically, a transistor is formed within the semiconductor mesa. During oxide deglaze cycles, which are a normal part of integrated circuit processing of mesa isolated SOI transistors, it is difficult to avoid etching of the exposed buried insulating layer. The etching of the exposed buried layer causes unwanted oxide undercutting of the SOI mesa. This undercutting has been shown to cause numerous problems with the devices ultimately constructed within the mesa. For example, the undercutting region has been shown to degrade gate oxide integrity at the bottom corner of the semiconductor mesa. Additionally, the undercutting causes a decrease in the radiation hardness of the device.

The prior art methodologies for forming a semiconductor mesa in a SOI architecture result in the above-mentioned undercut regions. Accordingly, the undesirable results of degradation of gate oxide integrity and increased susceptibility to the effects of radiation currently exist in contemporary SOI mesa devices. Therefore, a need has risen for an SOI mesa architecture and methodology which significantly reduces or eliminates the effects of undercutting discussed above.

SUMMARY OF THE INVENTION

In accordance with the present invention, an SOI mesa structure and methodology for forming the same are provided which substantially eliminate and prevent disadvantages and problems associated with prior mesa structures.

The method of the present invention includes forming a semiconductor mesa having sidewalls and adjacent an insulating layer. First sidewall spacers are formed adjacent the sidewalls of the mesa. Further, second sidewall spacers are formed adjacent the first sidewall spacers and opposite the mesa.

In accordance with the present invention, the second sidewall spacers may be formed to include foot portions extending away from the mesa and adjacent the insulating layer.

The present invention provides numerous technical advantages over prior SOI mesa configurations. An SOI mesa constructed in accordance with the present invention includes undercutting regions significantly removed from the semiconductor mesa, thereby reducing the detrimental effects of undercutting heretofore associated with semiconductor mesas in SOI technology. A particular technical advantage is that gate oxide integrity at the bottom corners of the semiconductor mesa is significantly improved. Further, through experimental use of the present invention, the technical advantage of increased radiation hardness of the device to total gamma dose has been observed. Additionally, there is the technical advantage that the undercutting regions associated with SOI processes may be shifted laterally away from the semiconductor mesa at a distance which is both variable and selectable for a given implementation of the present invention.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
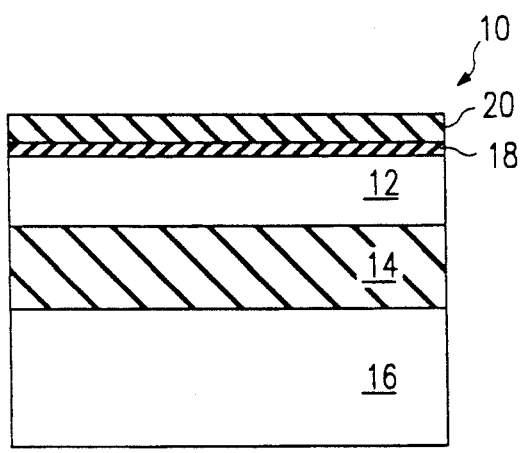
FIG. 1 illustrates a cross-sectional view of the prior art layer of materials utilized in the formation of a semiconductor mesa in an SOI structure.

FIG. 1 illustrates a cross-sectional view of the numerous layers of an SOI structure designated generally at 10. Structure 10 includes a semiconductor layer 12 overlying a buried insulating layer 14. Semiconductor layer 12 typically comprises a silicon layer while buried insulator layer 14 typically comprises an oxide layer. Buried insulating layer 14 overlies a substrate 16, which also typically comprises silicon. An insulating layer 18 overlies semiconductor layer 12. Insulating layer 18 typically comprises an oxide, which is grown on top of semiconductor layer 12 to a thickness on the order of 200 angstroms. A second insulating layer 20 is formed over first insulating layer 18. Second insulating layer 20 typically comprises silicon nitride on the order of 500 angstroms in thickness.

Figure 2:
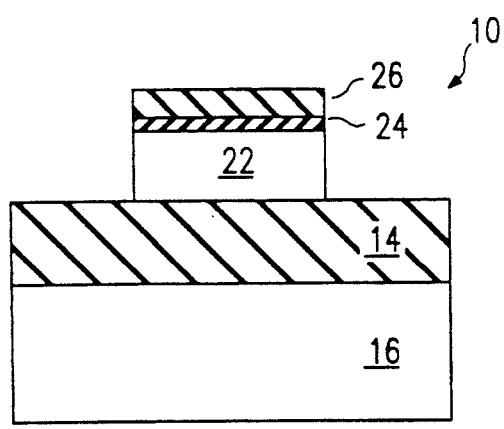
FIG. 2 illustrates a cross-sectional view of a prior semiconductor mesa formed from the layers shown in FIG. 1.

FIG. 2 illustrates a cross-sectional view of structure 10 shown in FIG. 1 following additional processing steps. Structure 10 of FIG. 1 is masked and subjected to a photolithographic anisotropic etch down to buried insulating layer 14. In particular, insulating layers 18 and 20 are first etched followed by a change in etchants in order to etch semiconductor layer 12. The latter etch step is selective to semiconductor materials and therefore etches down to, but stops at, buried insulating layer 14. As a result, and as shown in FIG. 2, a semiconductor mesa 22 remains overlying buried insulating layer 14. Further, first insulating layer 18 of FIG. I is reduced to a pad insulator region 24 overlying semiconductor mesa 22. Additionally, second insulating layer 20 of FIG. 1 is reduced to an insulator mask 26 overlying pad insulator region 24.

Figure 3:
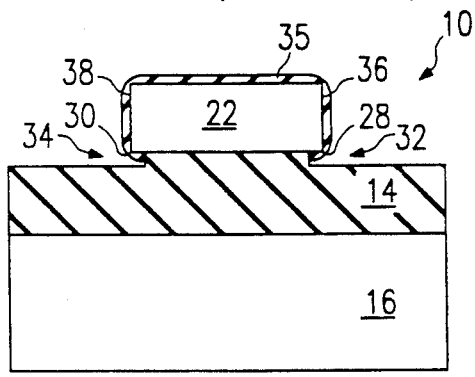
FIG. 3 illustrates a cross-sectional view of a prior art semiconductor mesa having undercut regions defined under the bottom corners of the mesa.

FIG. 3 illustrates a cross-sectional view of structure 10 from FIGURE 2 following removal of pad insulator region 24 and insulator mask 26 from semiconductor mesa 22. This removal process causes an isotropic reduction of all insulating materials associated with structure 10. Accordingly, buried insulating layer 14 is diminished in a downward fashion and in addition, in a lateral fashion underneath semiconductor mesa 22. Further, bottom corners 28 and 30 of semiconductor mesa 22 are exposed. This exposure defines undercut areas 32 and 34 between bottom corners 28 and 30, respectively, and buried insulating layer 14.

Under typical prior art fabrication techniques, an additional insulating region 35 is grown along sidewalls 36 and 38 and overlying semiconductor mesa 22. Insulating region 35 will further extend along the exposed semiconductor material lying within undercut areas 32 and 34. Insulating region 35 tends to thin as it rounds bottom corners 28 and 30. As a result, the thinned insulating region which will exist in the ultimate device constructed utilizing semiconductor mesa 22 will be a point where voltage breakdown may occur. Additionally, experiments have shown that the thinned insulating region causes the device to be more susceptible to operate in an undesirable fashion when exposed to radiation. The present invention, however, substantially reduces or eliminates the effects of undercut areas 32 and 34, thereby increasing the integrity of the insulating region adjacent the semiconductor mesa 22 and increasing the radiation hardness of a device constructed therein.

The preferred embodiments of the present invention are illustrated in FIGS. 4–7 of the drawings, like numerals being used to refer to like and corresponding parts of the various drawings.

Figure 4:
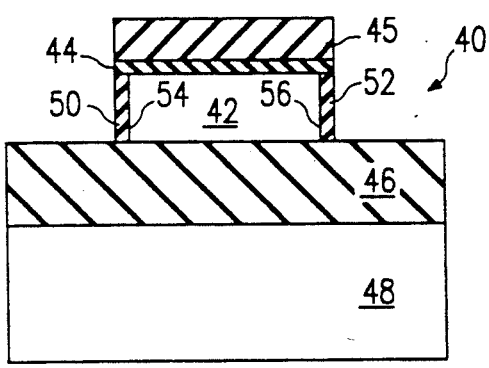
FIG. 4 illustrates a cross-sectional view of a semiconductor mesa processed in accordance with the present invention.

FIG. 4 illustrates a cross-sectional view of an SOI structure 40 constructed in accordance with the present invention. SOI structure 40 from FIG. 4 is initially formed utilizing the same processing steps discussed in connection with FIGS. 1 and 2 above. Accordingly, a semiconductor mesa 42 is formed having a pad insulator region 44 lying thereover. An insulator mask 45, typically comprising nitride, overlies pad insulator region 44. Further, semiconductor mesa 42 overlies a buried insulating layer 46 which overlies a substrate 48. After the formation of semiconductor mesa 42, however, the inventive processes and structure of the present invention are implemented rather than proceeding directly to the formation of structure 10 shown in FIG. 3. In particular, after the formation of semiconductor mesa 42, sidewall insulator regions 50 and 52 are formed adjacent sidewalls 54 and 56, respectively, of semiconductor mesa 42. In the preferred embodiment, sidewall insulator regions 50 and 52 are an oxide material grown on sidewalls 54 and 56. These oxide regions may be formed by exposing SOI structure 40 to an oxygen ambient at 1000° C. A preferable thickness for sidewall insulator regions 50 and 52 is on the order of 200 angstroms.

In the preferred embodiment, sidewall insulator regions 52 and 54 provide an insulating region to prevent current leakage from semiconductor mesa 42 to conductors which may thereafter be formed promixate thereto. Further, insulator regions 52 and 54 act as protective layers to prevent contact between semiconductor mesa 42 and other materials or processing solutions which could otherwise cause such damage as stress or degradation to or semiconductor mesa 42.

Once sidewall insulator regions 50 and 52 are formed, insulator mask 45 overlying pad insulator region 44 may be removed without exposing semiconductor mesa 42 to the solution utilized for the removal process. In particular, a hot phosphoric acid may be used to remove this insulator mask.

Figure 5:
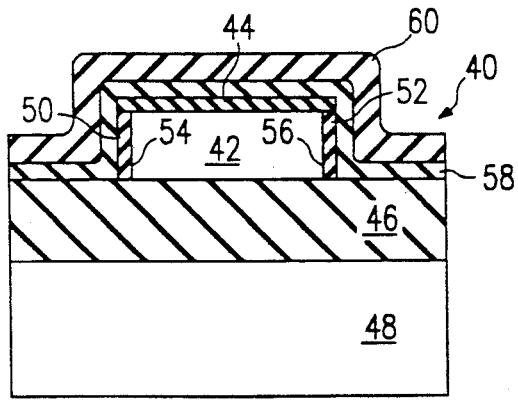
FIG. 5 illustrates a cross-sectional view of the structure of FIG. 4 having an additional two layers formed thereover.

FIG. 5 illustrates a cross-sectional view of SOI structure 40 of the present invention after additional processing steps. A non-oxidizable layer 58 is formed over SOI structure 40 and therefore along buried insulating layer 46, sidewall insulator regions 50 and 52 and pad insulator region 44. Non-oxidizable layer 58 in the preferred embodiment is a deposited silicon nitride lo layer. The deposition is accomplished by a low pressure chemical vapor deposition (LPCvD) and is deposited at a thickness on the order of 150 angstroms. Additional non-oxidizable substances such as silicon carbide may also be used for non-oxidizable layer 58. The reasons for using a non-oxidizable material for layer 58 are made more readily apparent below.

A conformal layer 60 is formed overlying non-oxidizable layer 58. Conformal layer 60 in the preferred embodiment comprises TEOS oxide. Conformal layer 60 is deposited using an LpCVD process and in the preferred embodiment is on the order of 1000 angstroms in thickness. In addition to being a conformal layer, it is further preferable that the material comprising conformal layer 60 is easily removable during subsequent processing steps. Accordingly, the use of a TEOS oxide provides conformal properties along with ease and removability during subsequent processing steps as discussed below.

Figure 6:
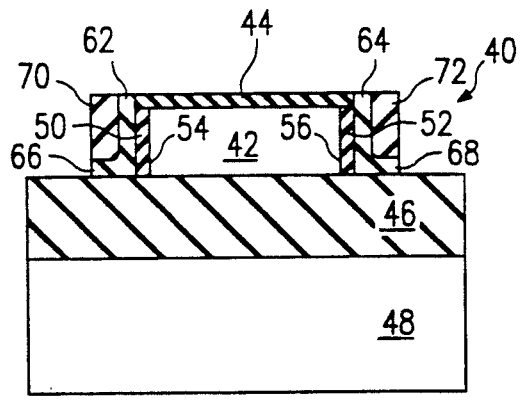
FIG. 6 illustrates the structure of FIG. 5 following an anisotropic etch step.

FIG. 6 illustrates a cross-sectional view of SOI structure 40 following an etch of non-oxidizable layer 58 and conformal layer 60. Preferably, an anisotropic plasma etch is performed on these layers down to pad insulator region 44 and buried insulating layer 46. As a result, sidewall spacers 62 and 64 are defined adjacent sidewall insulator regions 50 and 52, respectively. Sidewall spacer 62 and 64 each include a foot 66 region and 68, respectively, which extends outwardly from semiconductor mesa 42 along buried insulating layer 46. Secondary sidewall spacers 70 and 72 are formed along sidewall spacers 62 and 64, respectively, and extend laterally at a thickness equal to that of foot regions 66 and 68. In particular, from FIG. 5 and FIG. 6, it may be appreciated that the anisotropic etch of the configuration shown in FIG. 5 causes the length of foot regions 66 and 68 to equal that of the thickness of conformal layer 60 shown in FIG. 5. Thus, in accordance with the present invention, the thickness of conformal layer 60 may be adjusted in order to provide for a variable length of foot regions 66 and 68 as required by the particular implementation of the invention.

The use of a non-oxidizable substance for non-oxidizable layer 58 and resulting sidewall spacers 62 and 4 may further be appreciated from the perspective of FIG. 6. In particular, under typical processing schemes, SOI structure 40 may be subjected to further oxidizing ambients. It is quite often desirable to minimize the width of sidewall insulator regions 50 and 52. Accordingly, the use of a non-oxidizable substance adjacent to these regions prevents further oxidation of regions 50 and 52 during subsequent processing steps. As a result, sidewall insulator regions 50 and 52 are isolated from the possibility of further oxidization and therefore will not increase in thickness, thereby maintaining these regions at a minimal thickness as commonly desired.

Figure 7:
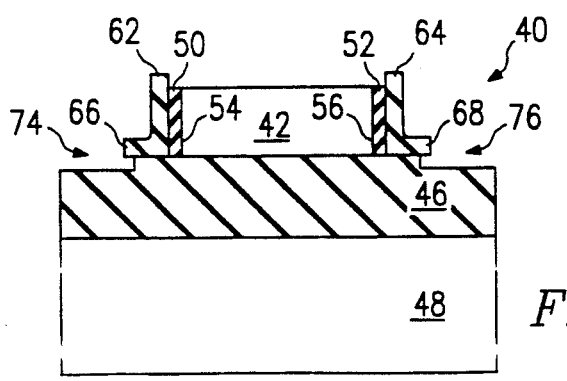
FIG. 7 illustrates a cross-sectional view of a semiconductor mesa constructed in accordance with the present invention having undercut regions shifted laterally away from the bottom corners of the semiconductor mesa.

FIG. 7 illustrates a cross-sectional View of SOI structure 40 after additional processing steps. The structure illustrated in FIG. 6 is subjected to an oxide deglaze process. Accordingly, each exposed area including an oxide material is isotropically etched in the preferred embodiment. This deglaze process is performed by utilizing a ten (10%) percent hydrofluoric acid solution. As a result of the isotropic etch, secondary sidewall spacers 70 and 72 are completely removed. Further, pad insulator region 44 is removed, thereby exposing the top of semiconductor mesa 42. Additionally, the isotropic etch causes a reduction of buried insulating layer 46 in both a vertical and lateral fashion. As a result, undercut areas 74 and 76 are formed under foot regions 66 and 68, respectively. Accordingly, the length of foot regions 66 and 68 ultimately determines the lateral distance between semiconductor mesa 42 and respective undercut areas 74 and 76. As discussed above, the width of conformal layer 60 (FIG. 5) determines the length of foot regions 66 and 68. Therefore, the width of conformal layer 60 also determines the lateral distance between semiconductor mesa 42 and undercut areas 74 and 76. Thus, the present invention provides a method and structure for selectively varying the distance between semiconductor mesa and its associated undercut areas 74 and 76.

From a comparison of the inventive structure 40 of FIG. 7 to the prior art structure 10 of FIG. 3, it may be appreciated that the undercut areas formed in accordance with the present invention are moved a lateral distance away from the respected semiconducted mesa. As a result, the problems of gate oxide integrity and radiation susceptibility discussed in connection with FIGS. 1 through 3, are significantly reduced by distancing the semiconductor mesa from the undercut areas as accomplished with the present invention. Further through experimental use of the present invention, it has in fact, been determined that those gate oxide integrity and radiation hardness are substantially improved by utilization of the present invention.

SOI structure 40 illustrated in FIG. 7, may next be subjected to standard processing steps. For example, a gate oxide may be grown over semiconductor mesa 42 followed by the deposition of a gate polysilicon conductor in order to form a transistor structure utilizing the semiconductor mesa. From the above, it may be appreciated that the present invention provides an improved semiconductor mesa and the method of forming the same. Undercut areas associated with the mesa are laterally shifted away therefrom. Accordingly, a device constructed utilizing the improved semiconductor mesa will have improved gate oxide integrity and radiation hardness.

Although the present invention has been described in detail, it should be understood that various changes, substitutions and alterations can be made hereto without departing from the spirit and scope of the invention as defined by the appended claims.

What is claimed is:

1. A semiconductor device, comprising:
   a semiconductor mesa adjacent an insulating layer and having a sidewall;
   at least one transistor structure formed in said semiconductor mesa;
   a sidewall spacer adjacent the sidewall of the mesa; and
   an undercut region adjacent the sidewall spacer on the side of the sidewall spacer opposite the sidewall of the semiconductor mesa, said undercut region not extending beneath said mesa.

2. The semiconductor device of claim 1 wherein said sidewall spacer comprises a sidewall spacer having a foot portion extending away from the mesa and adjacent the insulating layer.

3. The semiconductor device of claim 1 and further comprising an insulator region between the sidewall spacer and the sidewall of the mesa.

4. The semiconductor device of claim 3 wherein said insulator region comprises an oxide region.

5. The semiconductor device of claim 1 wherein said sidewall spacer comprises a non-oxidizable sidewall spacer.

6. The semiconductor device of claim 5 wherein said sidewall spacer comprises a nitride sidewall spacer.

7. The device of claim 1 and further comprising:
   a gate oxide layer formed over said semiconductor mesa; and
   a gate conductor formed over said gate oxide layer.

8. The device of claim 7 wherein said gate conductor comprises a polysilicon gate.

9. A semiconductor device, comprising:
   a semiconductor mesa having sidewalls and adjacent an insulating layer;
   at least one transistor structure formed in said semiconductor mesa;
   first sidewall spacers along the sidewalls of the mesa; and
   second sidewall spacers along the first sidewall spacers on the side of the first sidewall spacer opposite the mesa, the second sidewall spacers each having a respective foot portion extending away from the mesa and adjacent the insulating layer such that undercut areas are defined between the second sidewall spacers foot portion and the insulating layer.

10. The semiconductor device of claim 10 wherein said first sidewall spacers comprise grown insulator regions along the sidewalls of the mesa.

11. The semiconductor device of claim 9 wherein said first sidewall spacers comprises oxidizable sidewall spacers and wherein said second sidewall spacers comprise non-oxidizable sidewall spacers.

* * * * *